United States Patent [19]

Radosevich et al.

[11] Patent Number: 5,298,436
[45] Date of Patent: Mar. 29, 1994

[54] FORMING A DEVICE DIELECTRIC ON A DEPOSITED SEMICONDUCTOR HAVING SUB-LAYERS

[75] Inventors: Joseph R. Radosevich, Bethlehem; Pradip K. Roy, Allentown, both of Pa.

[73] Assignee: AT&T Bell Laboratories, Murray Hill, N.J.

[21] Appl. No.: 76,949

[22] Filed: Jun. 16, 1993

Related U.S. Application Data

[63] Continuation of Ser. No. 749,765, Aug. 26, 1991, abandoned.

[51] Int. Cl.⁵ ............................................. H01L 21/20
[52] U.S. Cl. ........................................ 437/29; 437/43; 437/112; 437/141; 437/191; 437/233; 156/613; 156/614
[58] Field of Search ............... 437/112, 191, 233, 29, 437/43, 141; 156/613, 614; 148/DIG. 25, DIG. 29

[56] References Cited

U.S. PATENT DOCUMENTS

| | | | |
|---|---|---|---|
| 4,631,804 | 12/1986 | Roy | 29/576 |
| 4,742,020 | 5/1988 | Roy | 437/61 |
| 4,814,291 | 3/1989 | Kim et al. | 437/52 |
| 4,992,391 | 2/1991 | Wang | 437/43 |

OTHER PUBLICATIONS

Abstract No. 257, S. P. Tay, J. P. Ellul, M. I. H. King, J. J. White, "Thin Gate and Poly Oxides by High-Pressure Silicon Oxidation", (1985) Oct., No. 2 Pennington, N.J., USA, pp. 386, 387.
Abstract No. 258, J. P. Ellul, S. P. Tay, J. J. White, M. I. H. King, "Nitsinitride VLSI Dielectrics", (1985) Oct., No. 2, Pennington, N.J., USA, pp. 388, 389.

*Primary Examiner*—Olik Chaudhuri
*Assistant Examiner*—Ramamohan Rao Paladugu
*Attorney, Agent, or Firm*—James H. Fox

[57] ABSTRACT

A high quality dielectric layer, typically silicon dioxide, is formed on a multi-layer deposited semiconductor structure, typically polysilicon or amorphous silicon. The multi-layer structure is formed by varying the silicon deposition rate so as to obtain a low stress deposited silicon structure. The low stress allows for a higher quality dielectric to be formed on the exposed top surface. One application is for thin film transistor gate oxides. Other applications included capacitor dielectrics and the tunnel oxide on the floating gate of EE-PROMs.

26 Claims, 2 Drawing Sheets

FORMING A DEVICE DIELECTRIC ON A DEPOSITED SEMICONDUCTOR HAVING SUB-LAYERS

This application is a continuation of application Ser. No. 07/749765, filed on Aug. 26, 1991 now abandoned.

BACKGROUND OF THE INVENTION

1. Field of the Invention

The present invention relates to a technique for making a semiconductor device that includes the formation of an improved quality dielectric on a deposited semiconductor layer.

2. Description of the Prior Art

In the production of semiconductor devices, a layer of a dielectric material is often formed on a layer of deposited silicon. For example, as shown in FIG. 1, a first capacitor plate may be formed by depositing a first conductive layer of doped polysilicon (103) on a substrate (101) having a dielectric layer (102) thereon. The top surface of the first polysilicon layer is then oxidized, to form the capacitor dielectric (104). Then, the second capacitor plate is formed by depositing a second conductive layer (105), which may be a metal or doped polysilicon. A high quality capacitor dielectric (105) is indicated by a high breakdown voltage and low leakage current. In another device application, the surface of a deposited polysilicon layer is oxidized to serve as the thin "tunnel" oxide on the floating gate of an electrically erasable programmable read only memory (EEPROM). In that case, the quality of the dielectric is measured by the ability to allow electrons to tunnel from the floating gate while erasing the memory, while preventing the loss of stored charge at other times. In still another device application, a field effect transistor may be formed in a deposited silicon layer. The gate dielectric is then formed by oxidizing the top surface of the deposited silicon layer. The quality of the gate dielectric is measured in terms of low leakage current and low degree of charge trapping, while maintaining a thin dielectric for good device characteristics. The quality of the dielectric depends on the substructure (state of stress, grain structure and defect state) of the top surface of the polysilicon.

Still other device applications exist, and various criteria for a high quality dielectric may be defined in each case. The deposited silicon layer, as noted above, is typically polycrystalline silicon (polysilicon). However, the use of deposited amorphous silicon is also known in the art. The dielectric formed may include a silicon nitride layer in addition to, or in lieu of, the silicon dioxide layer. The usual method of forming the dielectric layer is by heating in an ambient comprising oxygen (to form an oxide) or nitrogen (to form a nitride) or both (to form an oxynitride). Either a dry or steam ambient, at atmospheric or hyperatmospheric pressure, is frequently used for oxide formation. The heating step may be accomplished in a convection oven over a period of an hour or more. However, more recently, the use of rapid thermal oxidation (RTO) has been investigated, so that the dielectric is formed in a few minutes, or even a few seconds. For example, see the description in U.S. Pat. No. 4,814,291, co-assigned with the present invention. Although successful in many respects, the prior art dielectric forming techniques are reaching practical limits in some cases. This is especially so with integrated circuit technologies that produce sub-micron minimum feature sizes.

SUMMARY OF THE INVENTION

We have invented a technique of making a solid state device, wherein a dielectric layer is formed on the exposed surface of a deposited semiconductor layer. The semiconductor layer is deposited under varying conditions to obtain sub-layering. A dielectric layer is then formed on this multi-layered semiconductor, typically by reacting it with an atmosphere comprising oxygen or nitrogen. The multi-layered semiconductor is typically polycrystalline as deposited, but may include one or more amorphous sub-layers. The properties of the resulting dielectric may be chosen for a particular device application by the appropriate choice of layering sequences for the deposited semiconductor.

DETAILED DESCRIPTION

The following detailed description relates to an improved method of forming a dielectric on a deposited semiconductor layer, which in the illustrative case is silicon. In the present invention, the process conditions used to deposit the silicon layer are varied so that sub-layering of the silicon layer occurs.

Figure 1:
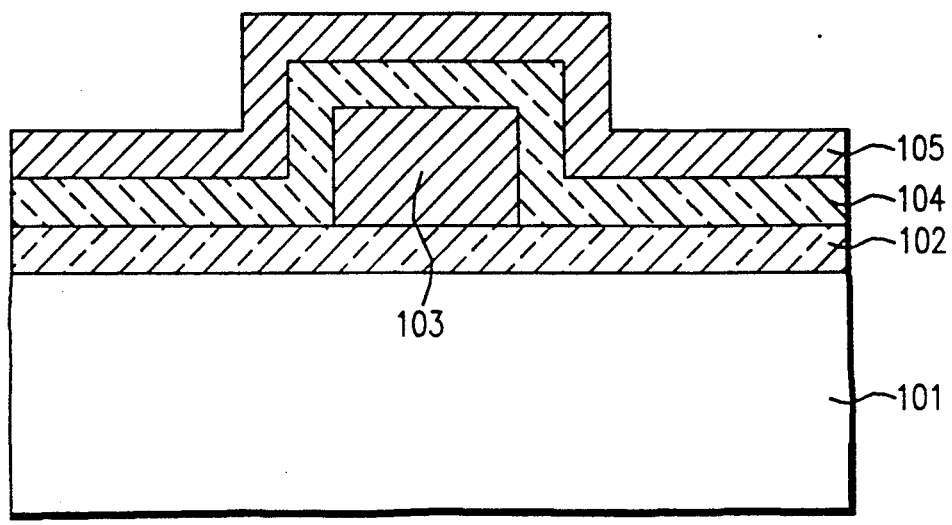
FIG. 1 shows a prior art capacitor formed with a deposited semiconductor layer.
Figure 2:
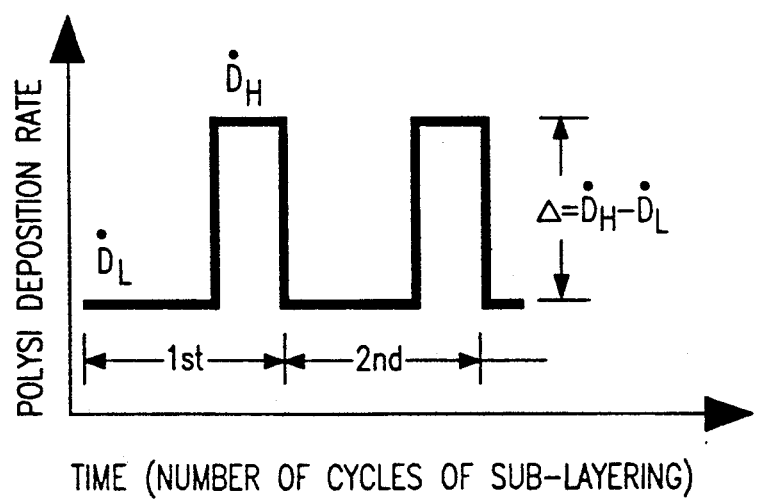
FIG. 2 shows one example of a periodic change in polysilicon deposition rate as a function of time.
Figure 4:
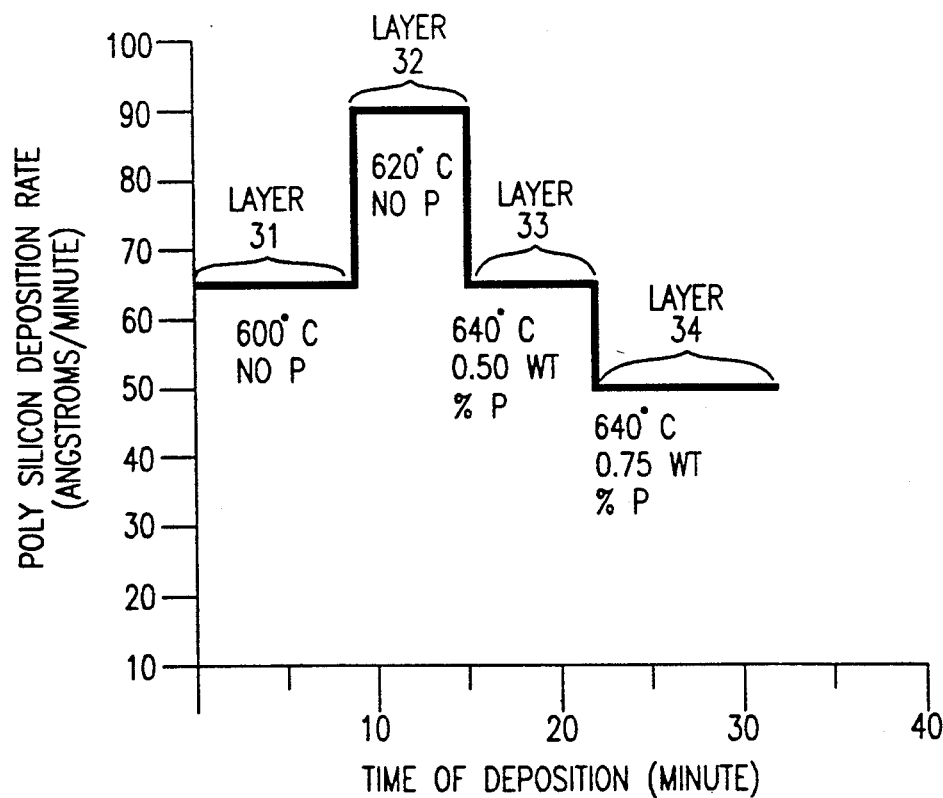
FIG. 4 shows the change in polysilicon deposition rate for Example 1.

Referring to FIG. 2, the rate of depositing the polysilicon layer is varied as a function of time. In the illustrative case, two periodic cycles are shown, producing four sub-layers of deposited polysilicon. However, the number of cycles, and hence number of sub-layers, may be any desired number. The deposition sequence typically begins with a low deposition rate ($D_L$), followed by a high deposition rate ($D_H$), which comprises the first cycle. The sequence may continue with additional cycles. Although the low deposition rate portion of each cycle are shown as the same in FIG. 2, these values may in fact change from cycle to cycle. Similarly, the high deposiiton rate portion may change from cycle to cycle. Alternatively, the changes in deposition rate need not by cyclic, as shown in FIG. 4, and discussed in Examples 1 and 2 below.

The deposition rate differences are typically produced by changing either the partial pressure or the gas flow rate of the semiconductor precursor gas, or both, during the deposition process. However, if a dopant gas or inert carrier gas are present during the semiconductor deposition process, the partial pressure or flow rate of either or both of these gases also effect the deposition rate, and may be used to accomplish the layering. Other factors, including the temperature, also affect the deposition rate, but typically to a lesser extent than the gas parameters. Note that the deposition process may occur from a plasma atmosphere, which atmosphere is also considered to be a "gas" as used herein.

The result of these changes during deposition is sub-layering of the deposited silicon, also referred to as "multi-layering" herein, wherein interfaces are produced between adjacent sub-layers. This sub-layering in some cases provides for stress accommodation within the polysilicon layer, allowing for improved dielectric formation. Other beneficial effects may accrue, including reduced channelling of an ion-implanted species through the polysilicon layer. For attaining the maximum benefits in terms of stress accommodation, and hence oxide quality formed on the deposited polysilicon, the number of sub-layers is desirably maximized. We recommend the use of at least four sub-layers.

As an additional step, a dielectric layer is formed on the deposited polysilicon layer. This may be accomplished by heating in a reactive atmosphere, which may be at standard atmospheric pressure, or alternatively at an elevated pressure for a faster reaction. The reaction may also be accelerated by rapid heating techniques known in the art. The reaction may also be assisted by a plasma, typically at sub-atmospheric pressure. To produce a dielectric that includes native semiconductor material, the reactive atmosphere typically includes oxygen if an oxide dielectric is desired, or nitrogen to form a nitride, for example. Alternatively, the dielectric layer may be formed by deposition techniques, as by decomposing a gas precursor. For example, tetraethylorthosilane (TEOS) or silane ($SiH_4$) may be used to deposit silicon dioxide, according to principles known in the art. In fact, it is possible to form an improved dielectric that includes both native and deposited semiconductor material formed in a "grow/deposit/grow" sequence; see, for example, U.S. Pat. No. 4,851,370 co-assigned herewith.

Figure 3:
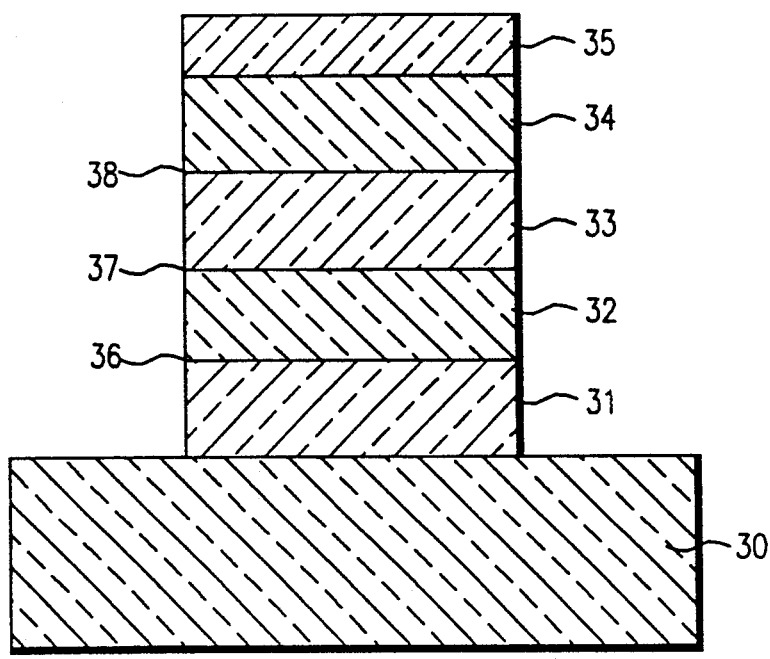
FIG. 3 shows deposited semiconductor sub-layers and a dielectric layer thereon.

The resulting structure is shown diagrammatically in FIG. 3, wherein the first through fourth polysilicon sub-layers (31 . . . 34) are shown as deposited on the dielectric layer 30. The dielectric layer 35 is shown on top. Note that the interfaces are indicated by the lines 36, 37 and 38 between adjacent sub-layers. These interfaces form the boundary between sub-layers having either differing defect states, textures, or phase transitions. For example, adjacent sub-layers may have different degrees of crystallinity, doping, grain structure, (including differences in grain size and orientation), texture, stress, or a phase transition may occur between sub-layers. Such changes in characteristics of polysilicon are often referred to as "sub-structural layering" by workers in the art.

One advantage of the present technique relates to the fact that the dielectric may be formed on the deposited polysilicon simultaneously with the formation of a dielectric (e.g., a gate oxide) on the silicon substrate, which is typically single-crystal silicon. This simultaneous dielectric formation is known in the art for use in the production of EEPROMS, for example. In that case, a dielectric is formed on the top surface of the polysilicon floating gate simultaneously with the formation of a gate dielectric on the silicon substrate for an adjacent MOS device. Still other examples of simultaneous dielectric formation on differing materials are known in the art. However, the simultaneous formation limits the flexibility of optimizing the process for the two different materials. For example, the time and temperature that is suitable for forming a gate oxide of a desired thickness on a silicon substrate may not yield the desired thickness or properties of the oxide formed on an adjacent polysilicon layer. The present technique thus allows for influencing the quality (e.g., thickness, breakdown voltage, conformality, tunneling characteristics, etc.) of the oxide grown on the deposited material independently of the characteristics of the oxide formed simultaneously on the other material.

The above process will be more fully illustrated by means of the following Examples.

EXAMPLE 1

Polysilicon was deposited by the low pressure chemical vapor deposition (LPCVD) technique onto a silicon dioxide gate dielectric layer on a silicon substrate. The deposition was accomplished by pyrolysis of silane ($SiH_4$). During portions of the deposition, the polysilicon was doped in situ by adding $PH_3$ gas diluted by nitrogen carrier gas to the silane atmosphere. The temperature of deposition, reactor pressure, and gas flow rate were adjusted to modulate the deposition process, as shown in FIG. 4. The first two layers (31, 32) were deposited at the temperatures indicated, at a pressure of 280 mTorr. However, the major change in the deposition rate was produced by a reduction in the silane flow rate from 165 standard cubic centimeters per minute (sccm) for layer 31 to 65 sccm for layer 32. The temperature increased for the third layer (33) concurrent with an increase of the pressure to 350 mTorr. However, the inclusion of the dopant gas (phosphine) at a rate of 15 sccm reduced the deposition rate for layer 33 as shown in FIG. 4, even though the flow rate of the silane was increased to 240 sccm for that layer. The reduced deposition rate of the final layer (34) was obtained by an increase in the flow rate of the phosphine to 26 sccm, even though the silane flow rate increased to 260 sccm. The deposition rate was varied from a low rate of 5 nanometer (50 angstroms) per minute to a high rate of 9 nanometers (90 angstroms) per minute for a total of 4 deposition sequences, as shown in FIG. 4. A total polysilicon thickness of about 200 nanometers (2000 angstroms) was achieved. This test sample is referred to as the "top-doped" sample herein.

As a control, a polysilicon layer was deposited at a constant rate of 5 nanometers (50 angstroms) per minute with 0.75 weight percent phosphorus to obtain an equal thickness (200 nanometers). The control was deposited under identical conditions to the final cycle (34) of the top-doped sample so that the top surface on which the dielectric layer is formed is the same.

On both the top-doped and control samples, a top oxide layer (35) was formed by oxidation in dry $O_2$ at 900 C. for 80 minutes. This produced an oxide layer 42 nanometers (420 angstroms) thick on the top-doped sample, and 58.5 nanometers (585 angstroms) thick on the control sample. Although the top polysilicon surfaces of both the top-doped and control samples were formed under identical deposition conditions, there is a difference in the total doping concentration of the polysilicon. This net difference in doping levels is reflected in the thickness of oxide grown on the polysilicon. The ratio of oxide growth rates of the top-doped to control samples was 0.72. The breakdown fields of the two samples were also determined, by depositing an additional doped polysilicon layer onto the top oxide layer, and applying an electric field thereacross, according to techniques known in the art. On a test vehicle consisting of two overlapping polysilicon layers, the breakdown field of the control sample was 4.1 MV/cm, whereas for the top-doped sample it was 5.0 MV/cm. Hence, a significant increase in breakdown field was obtained with the inventive technique. Although thinner oxides are known to break down at increased electric fields, the data suggests additional improvement with the top-doped multilayered structure.

EXAMPLE 2

The same deposition and oxidation procedures for test and control samples were followed as in Example 1, except that the layers were inverted in their order of deposition. Thus the test sample had a doping of the bottom layer (31 in FIG. 3) of 0.7 weight percent phosphorus, and the next layer (32) had a doping of 0.5 weight percent phosphorus. The upper two layers (33, 34) were undoped. This sample is referred to as "bottom-doped" herein. On both the bottom-doped and control samples, a top oxide layer (35) was formed as in Example 1. This produced an oxide layer 35 nanometers (350 angstroms) thick on the bottom-doped sample, and 585 angstroms thick on the control sample while growing 25.5 nanometers (255 angstroms) on a lightly doped single crystal silicon surface. Hence the ratio of oxide growth rates bottom-doped to control was 0.60. The breakdown fields of the two samples were also determined, as in Example 1. The breakdown field of the control sample was 4.1 MV/CM (as above), whereas for the bottom-doped sample it was 5.6 MV/cm. Hence a significant increase in breakdown field was obtained with the inventive technique.

Fowler-Nordheim Tunneling

Although the highest quality dielectric is often the goal there are applications which require a thin oxide with a well-controlled conductivity. Certain EEPROM designs rely on a properly textured polysilicon surface to promote geometrically enhanced Fowler-Nordheim tunneling to transfer charge from a dielectrically isolated floating gate. Here the irregular surface of an asperity, grain boundary or defined edge of the polysilicon floating gate can be accentuated during oxidation forming an emitting cathode. This effect arises from a differential growth rate of oxide due to surface curvature (concave and convex geometries) due to grain size and distribution, crystalline orientation of the individual grains and dopant species, concentration and distribution. In order to meet specific device requirements, the shape of and distribution of these emitting surfaces and their oxidation must be controlled. The goal of the polysilicon deposition and subsequent oxidations and heat treatments is to achieve a density of appropriately shaped cathodes and dielectric capable of achieving the necessary device performance. Measured electrical parameters include tunneling voltages, trap-up rates and charge to breakdown (QBD) in addition to breakdown voltages. These measurements are performed by stressing the dielectric with a constant injected current. The voltage developed across the dielectric after 10 seconds defines the tunneling voltage while the trap-up rate is defined as the change in voltage across the dielectric per decade of time over the same 10 second interval. The injected current density is then increased by a factor of 100 and the total charge injected through the dielectric to initiate breakdown is calculated.

The tunneling voltage for the top-doped structure (Example 1) was 12.2 V and 15.7 V for the control and the trap-up rate was 1.06 V/decade for the top-doped structure and 1.71 for the control. For these tests a lower value is desirable and thus a clear advantage is obtained with the top-doped layered structure. Charge-to-breakdown measurements for the control were 0.14 Coulombs/cm$^2$ and 0.79 Coulombs/cm$^2$ for the top-doped structure. A lower trap-up rate and higher QBD are indicative of greater endurance for EEPROMs. For the bottom-doped sample, (Example 2), the tunneling voltage was 12.3 V, and the trap-up rate was 0.91 V/decade (with the same control as before). Charge-to-breakdown measurements for the control were 0.14 Coulombs/cm$^2$ and 0.42 Coulombs/cm$^2$ for the top-doped structure. As with the top-doped sample, the bottom-doped sample demonstrated superior properties relating to EEPROM endurance characterization.

To compare the stress characteristics of polysilicon layers made by the inventive technique with those made by the conventional technique (and with single-crystal silicon), X-ray diffraction studies were conducted. The peak profiles of the Si (220) and Si (311) lines were determined. The inventive layered polysilicon films produced about a two-fold reduction in polysilicon crystallites strained in a direction of (110) crystal planes and a 30 percent reduction of the grain dimension. This implies that the inventive structure contained more isotropically-shaped crystal grains than the conventional layer. It was also found that the inventive structures had diffraction peaks that were intermediate between those for conventional polysilicon and single crystal silicon. Hence, the stress in the inventive structures was significantly less than that of conventional polysilicon. The stress accommodation provided by the present layering technique reduces localized stress-relief (weak spot) areas on the dielectric layer that is subsequently formed. Furthermore, the stress accommodation tends to produce a structurally improved polysilicon/dielectric interface. This has other structure and stress-related beneficial effects for many types of dielectric layers formed according to the inventive technique.

Although the deposited silicon of the present invention has been described above as "polysilicon", some or all of the sub-layers may be deposited in the form of amorphous silicon. The use of amorphous silicon has the otherwise known advantage of producing a relatively smooth surface, as compared to polysilicon. However, heating steps that are part of the normal IC production sequence subsequent to the deposition step will cause the nucleation and growth of silicon grains, thereby converting the amorphous silicon into polysilicon. Alternately or additionally, some of the deposited layers may be polysilicon that has different silicon grain sizes as compared to other layers. For example, it may be desirable to deposit larger-grained polysilicon with fewer grain boundaries for the later-deposited (upper) sub-layers, as compared to the initially-deposited (lower) sub-layers, in order to obtain a smoother top surface for improved dielectric formation. As is known in the art, the size of the silicon grains generally decreases at lower deposition temperature, and the deposited silicon becomes amorphous a deposition temperatures below about 570 degrees Centigrade.

Also, while the semiconductor (e.g., silicon) was in-situ doped in the test samples of the above Examples, similar trends have been observed with ex-situ phosphorus-doped samples. Such doping may be accomplished using ion-implantation or gas phase diffusion using PBr$_3$, among other techniques known in the art. Furthermore, while the above illustrative embodiment has been given in terms of silicon as the semiconductor material and silicon dioxide as the dielectric, other materials are possible. For example, silicon nitride or silicon oxynitride may be used as the dielectric in various silicon processes. In other examples, germanium or III-V materials may be used as the semiconductor, and germanium oxide or III-V oxides (e.g., gallium oxide or indium oxide) may serve as the dielectrics. The above-noted advantages are expected to occur in these cases also, although the magnitudes will likely differ from the illustrative cases shown above.

We claim:

1. A method of making a semiconductor device comprising the steps of depositing a semiconductor layer from a deposition gas, including a conductivity-enhancing dopant in said semiconductor layer, providing electrical contact to said semiconductor layer, and forming a dielectric on the exposed surface of said semiconductor layer.

Characterized in the said step of depositing a semiconductor layer is accomplished by varying the deposition rate of the semiconductor, wherein said varying is accomplished by changing at least one of the factors selected from the group consisting of: partial pressure and flow rate of the deposition gas, whereby at least four sub-layers of said semiconductor layer are formed.

2. The method of claim 1 further comprising the step of varying the concentration of said dopant in at least one sub-layer as compared to at least one other sub-layer.

3. The method of claim 1 wherein said semiconductor is silicon.

4. The method of claim 3 wherein said dielectric is silicon dioxide.

5. The method of claim 1 wherein said forming a dielectric on the deposited semiconductor layer is accomplished simultaneously with forming a dielectric on a single-crystal substrate underlying the deposited semiconductor layer.

6. The method of claim 5 wherein the dielectric formed on the single crystal substrate is a gate dielectric.

7. The method of claim 1 wherein the top sub-layer is less heavily doped than the underlying sub-layers.

8. The method of claim 1 wherein the bottom sub-layer is less heavily doped than the overlying sub-layers.

9. The method of claim 1 further comprising the step of varying the temperature of the semiconductor during said deposition.

10. A method of making a semiconductor device comprising the steps of depositing a silicon layer by the decomposition of a silicon-containing reactant gas, including a conductivity enhancing dopant in said silicon layer, providing electrical contact to said silicon layer, and forming a dielectric on the exposed surface of said silicon layer.

Characterized in the said step of depositing a silicon layer is accomplished by varying the deposition rate of the silicon, wherein said varying is accomplished by changing at least one of the factors selected from the group consisting of: partial pressure of the silicon-containing reactant gas and flow rate of the silicon-containing reactant gas, whereby at least four sub-layers of said silicon layer are formed;

and further comprising the step of varying the concentration of said dopant in at least one sub-layer as compared to at least one other sub-layer.

11. The method of claim 10 wherein said dielectric is silicon dioxide.

12. The method of claim 10 wherein said dopant is phosphorus.

13. The method of claim 1 further comprising the step of forming a conductive layer overlying said dielectric, and electrically contacting said conductive layer.

14. The method of claim 13 wherein said conductive layer comprises 2, phosphorus-doped polysilicon.

15. The method of claim 13 wherein said conductive layer is a metal.

16. The method of claim 13 wherein said device is a capacitor, with said layer forming a first capacitor plate, said dielectric forming a capacitor dielectric, and said conductive layer forming a second capacitor plate.

17. The method of claim 13 wherein said device is a field effect transistor, with said dielectric layer forming a gate dielectric.

18. The method of claim 13 wherein said device is an electrically erasable programmable read only memory (EEPROM), wherein said layer is a floating gate.

19. The method of claim 13 wherein said forming a dielectric on the deposited silicon layer is accomplished simultaneously with forming a dielectric on a silicon substrate underlying the deposited silicon layer.

20. The method of claim 19 wherein the dielectric formed on the silicon substrate is a gate oxide.

21. The method of claim 10 further comprising the step of forming a conductive layer overlying said dielectric, and electrically contacting said conductive layer.

22. The method of claim 21 wherein said conductive layer comprises phosphorus-doped polysilicon.

23. The method of claim 21 wherein said conductive layer is a metal.

24. The method of claim 21 wherein said device is a capacitor, with said silicon layer forming a first capacitor plate, said dielectric forming a capacitor dielectric, and said conductive layer forming a second capacitor plate.

25. The method of claim 21 wherein said device is a field effect transistor, with said dielectric layer forming a gate dielectric.

26. The method of claim 21 wherein said device is a electrically erasable programmable read only memory (EEPROM), wherein said silicon layer is a floating gate.

* * * * *